United States Patent [19]

Hisaka et al.

[11] Patent Number: 5,728,611

[45] Date of Patent: Mar. 17, 1998

[54] METHOD OF FABRICATING SEMICONDUCTOR DEVICE

[75] Inventors: Takayuki Hisaka; Kenji Hosogi; Naohito Yoshida, all of Tokyo, Japan

[73] Assignee: Mitsubishi Denki Kabushiki Kaisha, Tokyo, Japan

[21] Appl. No.: 630,471

[22] Filed: Apr. 10, 1996

[30] Foreign Application Priority Data

Sep. 12, 1995 [JP] Japan .................................. 7-233623

[51] Int. Cl.⁶ .................................................. H01L 21/338
[52] U.S. Cl. .............................................. 438/168; 438/518
[58] Field of Search ............................... 437/40–41, 912; 438/168, 518

[56] References Cited

U.S. PATENT DOCUMENTS

| | | | |
|---|---|---|---|
| 4,771,012 | 9/1988 | Yabu et al. | 437/29 |
| 5,471,073 | 11/1995 | Kohno | 257/108 |

FOREIGN PATENT DOCUMENTS

| | | |
|---|---|---|
| 63-226922 | 9/1988 | Japan . |
| 63-233567 | 9/1988 | Japan . |
| 133924 | 2/1989 | Japan . |
| 6433924 | 2/1989 | Japan . |

OTHER PUBLICATIONS

VanVlack, "Elements of Materials Science and Engineering", Addison–Wesley Publishing Company, pp. 84–89, 1989.

*Primary Examiner*—John Niebling
*Assistant Examiner*—Richard A. Booth
*Attorney, Agent, or Firm*—Leydig, Voit & Mayer, Ltd.

[57] ABSTRACT

A method of producing a semiconductor device includes preparing a semiconductor ingot having a (100) surface orientation and an orientation flat in a [01$\bar{1}$] direction; cutting the semiconductor ingot in a plane which is obtained by tilting the (100) surface by an angle $\theta$ about an axis of the tilting, obtained by rotating the [01$\bar{1}$] direction by an angle $\phi$ with the center of the (100) surface as an axis of the rotation, thereby producing a semiconductor wafer having a surface; producing a channel region in the semiconductor wafer; producing a refractory metal gate on the surface of the semiconductor wafer; and using the refractory metal gate as a mask, implanting dopant impurity ions into the semiconductor wafer in a direction perpendicular to the surface of the semiconductor wafer, thereby producing impurity-implanted regions in the semiconductor wafer. Channeling is prevented and the short-channel effect is suppressed.

2 Claims, 9 Drawing Sheets

$\theta x = \tan^{-1}(\tan \theta \sin \phi)$
$\theta y = \tan^{-1}(\tan \theta \cos \phi)$ $\theta x = \tan^{-1}(\tan\theta \sin\phi)$
$\theta y = \tan^{-1}(\tan\theta \cos\phi)$ Fig.12 Prior Art
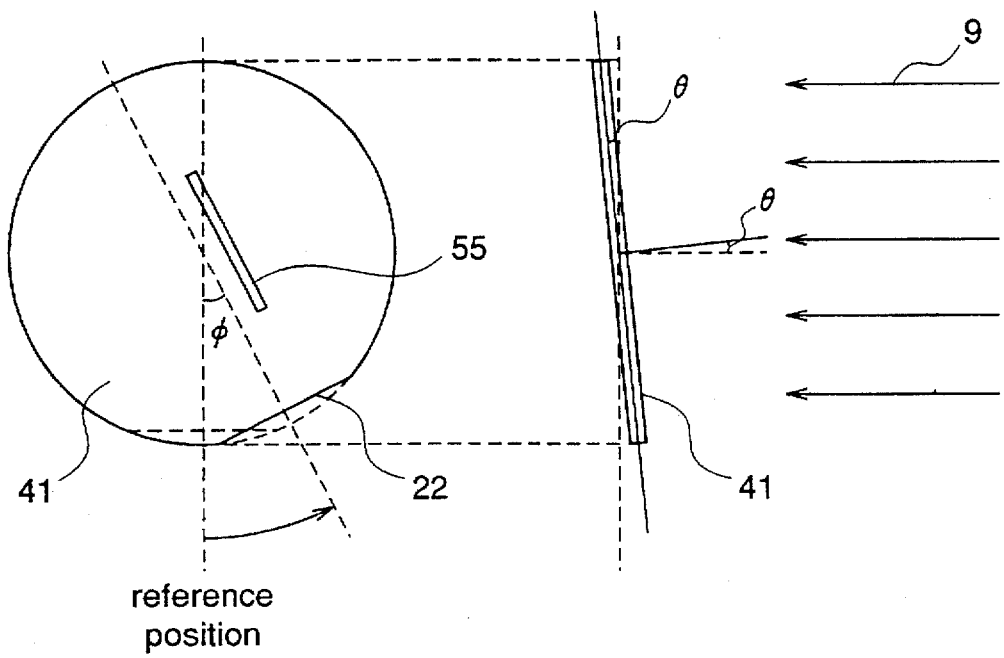
reference position
Prior Art
Fig.13 (a)
Fig.13 (b)
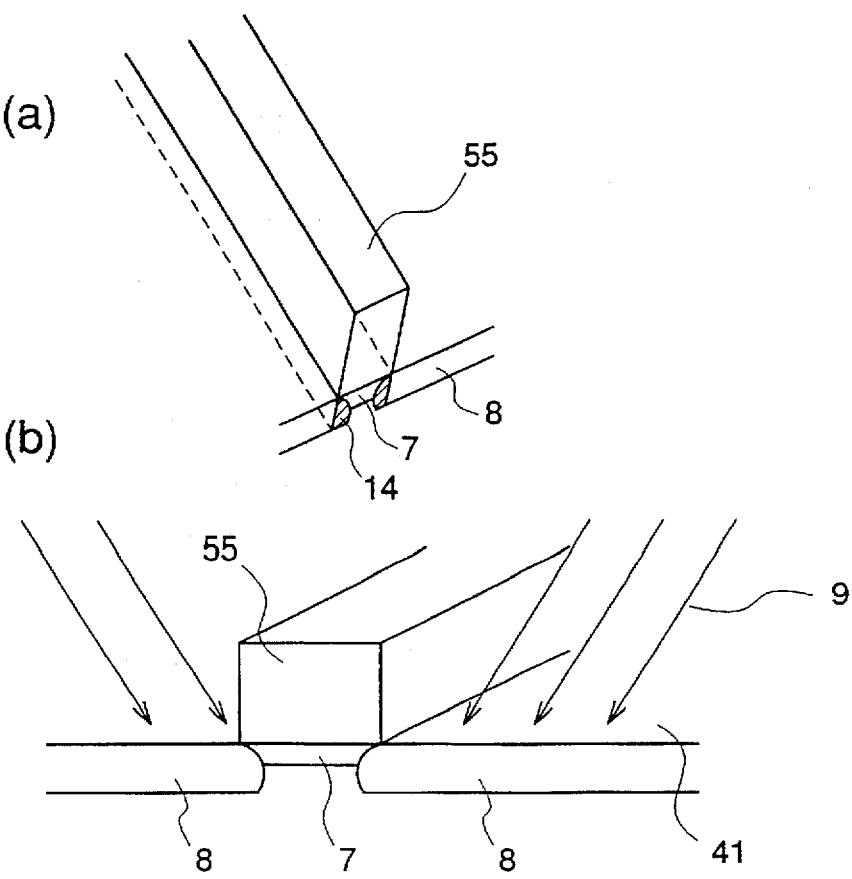

METHOD OF FABRICATING SEMICONDUCTOR DEVICE

FIELD OF THE INVENTION

The present invention relates to a method of fabricating a semiconductor device and, more particularly, to an ion implantation method for making a self-aligned gate field effect transistor (hereinafter referred to as SAGFET).

BACKGROUND OF THE INVENTION

FIGS. 10(a)–10(c) are cross-sectional views illustrating process steps in a method of fabricating an SAGFET according to a prior art. In the figure, reference numeral 10 designates a semiconductor substrate, numeral 5 designates a refractory metal gate, numeral 7 designates an n type channel region (hereinafter referred to as n region) having a dopant concentration, numeral 8 designates high dopant concentration n type regions (hereinafter referred to as $n^+$ regions) having a dopant concentration higher than the dopant concentration of the n type channel region 7, and reference numeral 11 designates ohmic electrodes.

A description is given of the fabrication process.

Initially, as illustrated in FIG. 10(a), dopant ions are selectively implanted into the semiconductor substrate 10 using a resist (not shown) as a mask to form the n region 7. Thereafter, the refractory metal gate 5 is produced on substrate 10, contacting the n region 7. Using the refractory metal gate 5 and the resist as masks, dopant ions are implanted into the substrate 10 to form the $n^+$ regions 8 (FIG. 10(b)). Finally, the ohmic electrodes 11 are produced on the substrate 10, contacting the $n^+$ regions 8 (FIG. 10(c)).

FIGS. 11(a)–11(e) are cross-sectional views illustrating process steps in a method of fabricating a lightly doped drain SAGFET (hereinafter referred to as LDD-SAGFET) according to a prior art. In these figures, the same reference numerals as those in FIGS. 10(a)–10(c) designate the same or corresponding parts. Reference numeral 12 designates intermediate dopant concentration n type regions (hereinafter referred to as n' regions) having a dopant concentration higher than the dopant concentration of the n region 7 and lower than the dopant concentration of the $n^+$ regions 8. Reference numeral 13 designate side walls.

A description is given of the fabrication process.

Initially, as illustrated in FIG. 11(a), dopant ions are selectively implanted into the semiconductor substrate 10 using a resist (not shown) as a mask to form the n region 7 and, thereafter, the refractory metal gate 5 is produced on the substrate 10, contacting the n region 7. Next, using the refractory metal gate 5 and the resist as masks, dopant ions are implanted into the substrate 10 to form the n' regions 12 (FIG. 11(b)). After formation of the side walls 13 (FIG. 11(c)), using the side walls 13 and the resist as masks, dopant ions are implanted into the substrate 10 to form the $n^+$ regions 8 (FIG. 11(d)). Finally, the ohmic electrodes 11 are produced on the substrate 10, contacting the $n^+$ regions 8 (FIG. 11(e)).

In the above-described methods of fabricating the SAGFET and the LDD-SAGFET, when the ion-implanted regions, i.e., the n region 7, the $n^+$ regions 8, and the n' regions 12, are produced, if the dopant ions are implanted in the direction perpendicular to the surface of the semiconductor wafer, channeling occurs. That is, when a crystalline structure, such as a semiconductor wafer, is subjected to ion implantation, if dopant ions are applied along a crystal axis or a crystal plane of the crystalline structure, some ions reach deep into the crystalline structure without striking on atomic nucleus or electron in the crystalline structure. This phenomenon is called channeling. When such channeling occurs, the controllability in the depth direction, i.e., the direction perpendicular to the surface of the crystalline structure, is degraded, resulting in uneven ion distribution.

FIG. 12 is a schematic diagram illustrating a prior art ion implantation method that prevents channeling. In FIG. 12, reference numeral 41 designates a semiconductor wafer having a (100) surface orientation and an orientation flat 22 in a [01$\bar{1}$] direction. Reference numeral 55 designates a refractory metal gate disposed on the semiconductor wafer 41 in a [0$\bar{1}\bar{1}$] direction that is perpendicular to the [01$\bar{1}$] direction.

A description is given of the ion implanting process.

Initially, the orientation flat 22 of the semiconductor wafer 41 is rotated by an angle $\phi$ (hereinafter referred to as OF rotating angle) from a reference position with the center of the planar surface of the wafer as an axis of rotation, and semiconductor wafer 41 is tilted by an angle $\theta$ (hereinafter referred to as tilt angle). After setting the semiconductor wafer 41 as described above, ion implantation is performed so that the direction 9 of the ion beam reaching the surface of the wafer 41 makes the angle $\theta$ with the normal of the surface of the wafer 41. In this method, since the ion implantation is performed not perpendicular direction but in oblique; to the surface of the semiconductor wafer 41, the dopant ions are not implanted along the crystal axis or the crystal plane of the wafer, whereby channeling is avoided.

When a GaAs wafer is employed, an optimum ion implantation for avoiding channeling is realized when the OF rotating angle $\phi$ is 23° and the tilt angle $\theta$ is 7°~10°.

When the ion implantation method shown in FIG. 12 is applied to the formation of the $n^+$ regions 8 of the SAGFET (FIG. 10(b)) or the formation of the n' regions 12 of the LDD-SAGFET (FIG. 11(b)), unwanted channeling is avoided. However, as shown in FIG. 13(a), the dopant ions reach portions 14 of the substrate under the refractory metal gate 55, whereby the n region 7 under the refractory metal gate 55 is eroded as shown in FIG. 13(b), resulting in the short channel effect. When the short channel effect is increased, the k value is reduced and the threshold voltage changes. Therefore, an SAGFET produced by the prior art ion implantation method cannot be applied to a digital IC that requires a high stability of the threshold voltage.

SUMMARY OF THE INVENTION

It is an object of the present invention to provide a method of fabricating a semiconductor device that prevents channeling and suppresses the short channel effect.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method of producing a semiconductor device comprises preparing a semiconductor ingot having a (100) surface orientation and an orientation flat in a [01$\bar{1}$] direction; cutting the semiconductor ingot in a plane which is obtained by tilting the (100) surface by an angle $\theta$ with a direction as an axis of the tilting, the direction is obtained by rotating the [01$\bar{1}$] direction by an angle $\phi$ with the center of the (100) surface as an axis of the rotation, thereby producing a semiconductor wafer having a surface; after producing a channel region in the semiconductor wafer, producing a refractory metal gate on the surface of the semiconductor wafer; and using the refractory metal gate as a mask, implanting dopant impurity ions into the semiconductor wafer in a direction perpendicular to the surface of the semiconductor wafer, thereby producing impurity-implanted regions in the semiconductor wafer. Therefore, channeling is prevented and short-channel effect is suppressed.

According to a second aspect of the present invention, a method of producing a semiconductor device comprises preparing a semiconductor wafer having a (100) surface orientation; producing a channel region in the semiconductor wafer; producing a refractory metal gate on the (100) surface of the semiconductor wafer in a direction that makes an angle φ with a [0$\overline{1}\overline{1}$] direction; and implanting dopant impurity ions into the semiconductor wafer using the refractory metal gate as a mask after setting the semiconductor wafer so that it is tilted by an angle θ from a plane perpendicular to the ion implanting direction, with a straight line as an axis of the tilting, the straight line being perpendicular to the direction in which the refractory metal gate is produced on the plane perpendicular to the ion implanting, direction, thereby producing impurity-implanted regions in the semiconductor wafer. Therefore, channeling is prevented and short-channel effect is suppressed.

According to a third aspect of the present invention, a method of producing a semiconductor device comprises preparing a semiconductor wafer having a (100) surface orientation; producing a channel region in the semiconductor wafer; producing an orientation flat on the semiconductor wafer in a direction that makes an angle φ with a [01$\overline{1}$] direction; producing a refractory metal gate on the surface of the semiconductor wafer in a direction perpendicular to the direction of the orientation flat; and implanting dopant impurity ions into the semiconductor wafer using the refractory metal gate as a mask after setting the semiconductor wafer so that it is tilted by an angle θ from a plane perpendicular to the ion implanting direction with the direction of the orientation flat as an axis of the tilting, thereby producing impurity-implanted regions in the semiconductor wafer. Therefore, channeling is prevented and short-channel effect is suppressed.

According to a fourth aspect of the present invention, a method of producing a semiconductor device comprises preparing a semiconductor ingot having a (100) surface orientation and an orientation flat; cutting the semiconductor ingot in a plane which is obtained by tilting the (100) surface by an angle θx with a [011] direction as an axis of the tilting, thereby producing a semiconductor wafer having a surface and an orientation flat; after producing a channel region in the semiconductor wafer, producing a refractory metal gate on the surface of the semiconductor wafer in a direction perpendicular to the orientation flat; and implanting dopant impurity ions into the semiconductor wafer using the refractory metal gate as a mask after setting the semiconductor wafer so that it is tilted by an angle θy from a plane perpendicular to the ion implanting direction with the direction of the orientation flat as an axis of the tilting, thereby producing impurity-implanted regions in the semiconductor wafer. Therefore, channeling is prevented and short-channel effect is suppressed.

According to a fifth aspect of the present invention, a method of producing a semiconductor device comprises preparing a semiconductor wafer having a surface; producing a channel region in the semiconductor wafer; producing a refractory metal gate having opposed side walls on the surface of the semiconductor wafer so that the side walls are inclined by an angle with respect to the surface of the semiconductor wafer and are parallel to an ion implanting direction in subsequent ion implantation process; and implanting dopant impurity ions into the semiconductor wafer with the refractory metal gate as a mask in a direction that makes the angle with the surface of the semiconductor wafer, thereby producing impurity-implanted regions in the semiconductor wafer. Therefore, channeling is prevented and short-channel effect is suppressed.

BRIEF DESCRIPTION OF THE DRAWINGS

FIG. 12 is a diagram illustrating an ion implantation method according to the prior art.

FIGS. 13(a) and 13(b) are perspective views, partly in section, illustrating a part of a semiconductor wafer in the vicinity of a refractory metal gate, for explaining a problem in the prior art ion implantation method.

DETAILED DESCRIPTION OF THE PREFERRED EMBODIMENTS

[Embodiment 1]

Figure 1:
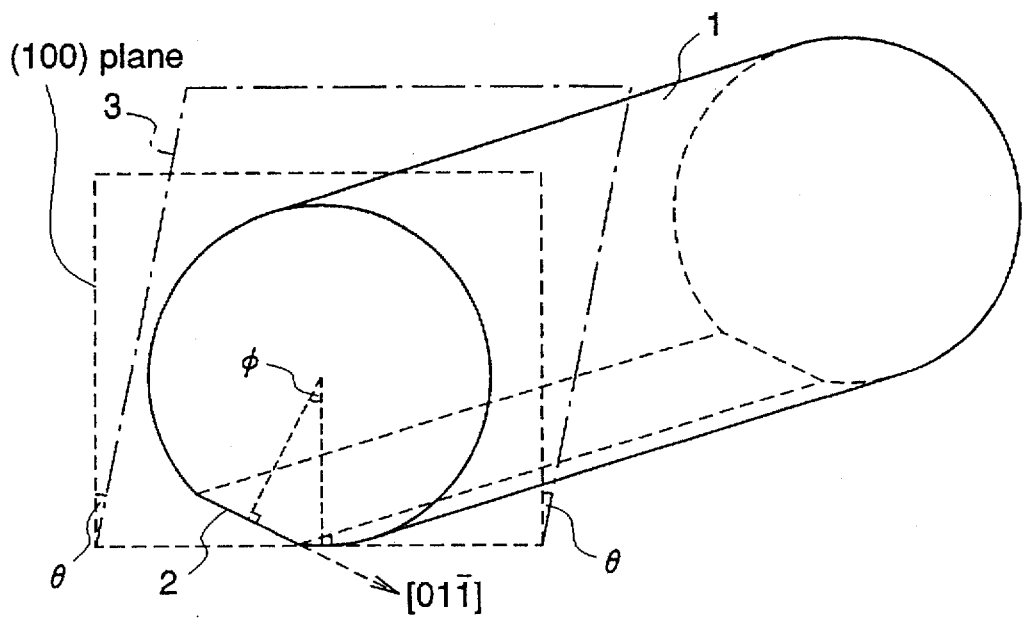
FIG. 1 is a perspective view for explaining a method of producing a semiconductor wafer in accordance with a first embodiment of the present invention.
Figure 2:
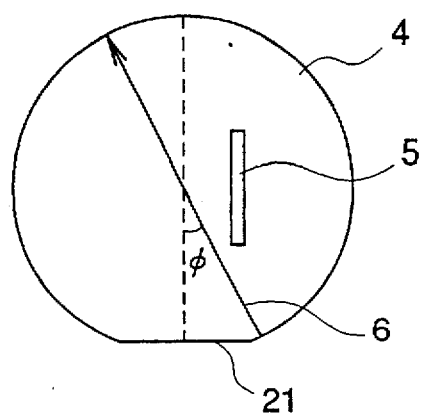
FIG. 2 is a plan view illustrating a semiconductor wafer according to the first embodiment of the invention.
Figure 3:
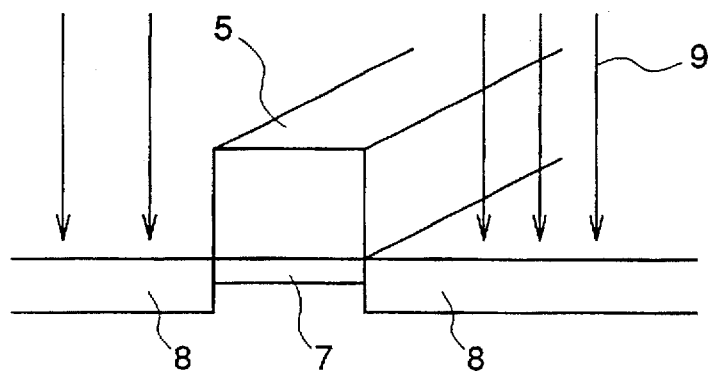
FIG. 3 is a perspective view, partly in section, illustrating a part of the semiconductor wafer shown in FIG. 2 in the vicinity of a refractory metal gate, for explaining an ion implantation method according to the first embodiment of the invention.

FIG. 1 is a perspective view of a semiconductor ingot for explaining a method of producing a semiconductor wafer in accordance with a first embodiment of the invention. FIG. 2 is a plan view illustrating the semiconductor wafer. FIG. 3 is a perspective view, partly in section, illustrating a part of the semiconductor wafer in the vicinity of a refractory metal gate, for explaining an ion implantation method according to the first embodiment of the invention. In these figures, reference numeral 1 designates a semiconductor ingot, such as a GaAs ingot, having a (100) surface orientation and an orientation flat 2 in a [01$\bar{1}$] direction, numeral 3 designates a plane of the ingot 1 along which a semiconductor wafer is cut off (hereinafter referred to as wafer cut-off plane), numeral 4 designates a semiconductor wafer, numeral 5 designates a refractory metal gate disposed on the semiconductor wafer 4, numeral 6 designates a direction in which the semiconductor wafer is cut off (hereinafter referred to as wafer cut-off direction), and numeral 21 designates an orientation flat of the semiconductor wafer 4. The wafer cut-off plane 3 is obtained in the following manner. That is, the orientation flat 2 in the [01$\bar{1}$] direction is rotated by an angle $\theta$ with the center of the (100) plane of the ingot 1 as an axis of the rotation, and the (100) plane of the ingot 1 is tilted by an angle $\theta$ with the rotated orientation flat 2 as an axis of the tilting. A semiconductor wafer 4 that is cut out of the ingot 1 along the cut-off plane 3 is shown in FIG. 2. In FIG. 2, the surface of the semiconductor wafer 4 is inclined by the angle $\theta$ from the (100) plane in the wafer cut-off direction 6. A refractory metal gate 5 is produced on the surface of the semiconductor wafer 4. After formation of the refractory metal gate 5, dopant ions for producing $n^+$ regions 8 are implanted into the semiconductor wafer 4 in the direction perpendicular to the surface of the semiconductor wafer 4.

In this first embodiment of the invention, when the $n^+$ regions 8 are produced by the ion implantation using the refractory metal gate 5 as a mask, although the ion beam 9 is applied to the semiconductor wafer 4 at a right angle to the wafer surface, the ion beam is not parallel to the crystal plane or the crystal axis in the semiconductor wafer 4. Therefore, the probability of the implanted ions colliding with atomic nucleuses and electrons in the crystal is increased, whereby channeling is prevented. When a GaAs ingot is employed, optimum angles of $\phi$ and $\theta$ for preventing channeling are 23° and 7°–10°, respectively.

Since the ion beam applied to the semiconductor wafer 4 is perpendicular to the surface of the semiconductor wafer 4, the side walls of the refractory metal gate 5 are parallel to the direction of the ion beam. Therefore, when the $n^+$ regions 8 are produced by the ion implantation, unwanted invasion of implanted ions into a region under the refractory metal gate 5 is reduced, whereby the short channel effect is suppressed.

Although the ion implantation method according to this first embodiment is applied to the formation of $n^+$ regions, it may be applied to the formation of n' regions in an LDD-SAGFET.

While in this first embodiment a semiconductor ingot having a (100) surface orientation is employed, a semiconductor ingot having a surface in a plane equivalent to the (100) plane or a semiconductor ingot having a surface in another crystal plane, such as a (111) plane, may be employed with the same effects as described above.

While in this first embodiment the orientation flat 2 is taken along the [01$\bar{1}$] direction when the semiconductor ingot 1 has a (100) surface orientation, the orientation flat 2 may be in a direction equivalent to the [01$\bar{1}$] direction.

[Embodiment 2]

Figure 4:
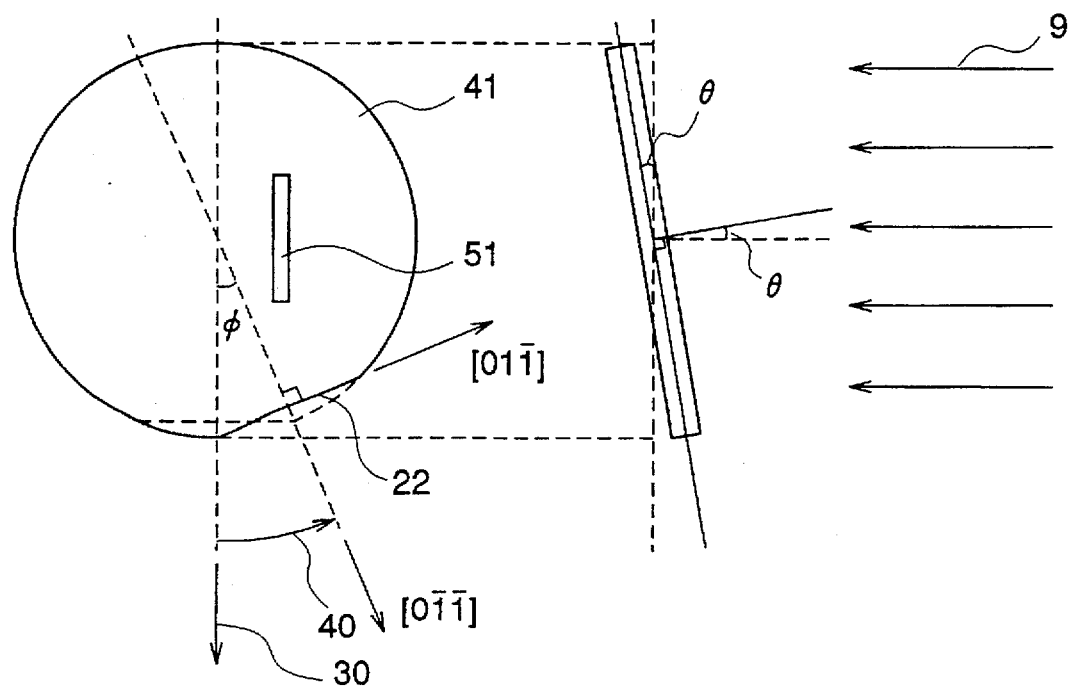
FIG. 4 is a diagram for explaining an ion implantation method in accordance with a second embodiment of the present invention.

FIG. 4 is a diagram for explaining an ion implantation method in accordance with a second embodiment of the present invention. In the figure, the same reference numerals as those in FIG. 12 designate the same or corresponding parts. Reference numeral 51 designates a refractory metal gate. Reference numeral 30 designates a direction that makes an angle $\phi$ with the direction perpendicular to the orientation flat 22, and the refractory metal gate 51 is parallel to the direction 30. Reference numeral 40 designates a direction in which the orientation flat 22 of the wafer 41 is rotated in the ion implanting process. The semiconductor wafer 41 and the orientation flat 22 are identical to those shown in FIG. 12 according to the prior art.

In FIG. 4, a refractory metal gate 51 is disposed on the surface of the semiconductor wafer 41 parallel to the direction 30 that makes an angle $\phi$ with the [01$\bar{1}$] direction that is perpendicular to the orientation flat 22. More specifically, the direction 30 is obtained by inclining the [01$\bar{1}$] direction that is perpendicular to the orientation flat 22 by the angle $\phi$, in a direction opposite to the orientation flat rotating direction 40, with the center of the wafer surface as an axis of the rotation. In the ion implanting process, the orientation flat 22 of the wafer 41 is rotated by the angle $\phi$ (OF rotating angle) from a reference position, in the direction 40, with the center of the wafer surface as an axis of the rotation. Then, the semiconductor wafer 41 is tilted by an angle $\theta$ (tilt angle) with a line perpendicular to the direction 30 as an axis of the tilting. After setting the semiconductor wafer 41 as described above, ion implantation is performed so that the direction of ion beam 9 reaching the surface of the wafer 41 makes the angle $\theta$ with the normal of the surface of the semiconductor wafer 41.

According to the second embodiment of the present invention, since the ion implantation is performed not perpendicular to, but oblique the surface of a semiconductor wafer 41, a ion implantation is not parallel to the crystal plane or the crystal axis in the semiconductor wafer 41. Therefore, channeling is prevented. When a GaAs wafer is employed, an optimum ion implantation for preventing channeling is realized when $\phi$ is 23° and $\theta$ is 7°–10°.

Furthermore, since the refractory metal gate 51 is disposed on the semiconductor wafer in the direction that is inclined from the direction perpendicular to the orientation flat 22 by the same angle as the orientation flat rotating angle $\phi$, the side walls of the refractory metal gate 51 are parallel to the direction of the ion beam. Therefore, when the $n^+$ regions are produced by the ion implantation, unwanted invasion of implanted ions into a region under the refractory metal gate 51 is reduced, whereby the short channel effect is suppressed.

Although the ion implantation method according to this second embodiment is applied to the formation of $n^+$ regions, it may be applied to the formation of n' regions in an LDD-SAGFET.

While in this second embodiment of the invention a semiconductor wafer having a (100) surface orientation is employed, a semiconductor wafer having a surface in a plane equivalent to the (100) plane or a semiconductor wafer having a surface in another crystal plane, such as a (111) plane, may be employed with the same effects as described above.

[Embodiment 3]

Figure 5:
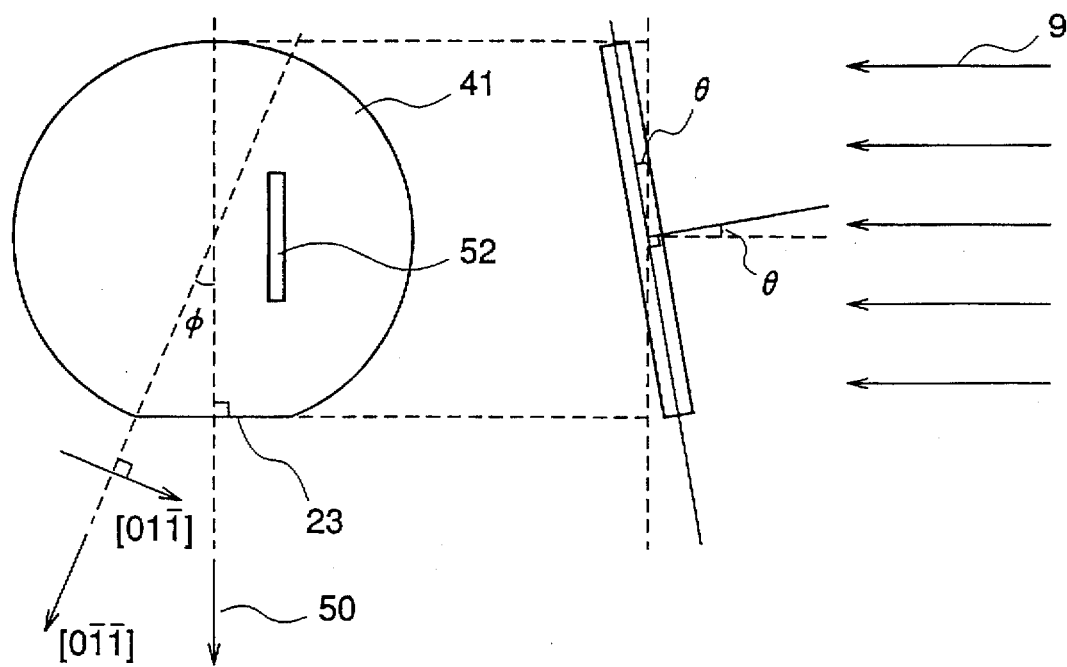
FIG. 5 is a diagram for explaining an ion implantation method in accordance with a third embodiment of the present invention.

FIG. 5 is a diagram for explaining an ion implantation method in accordance with a third embodiment of the present invention. In the figure, the same reference numerals as those in FIG. 4 designate the same or corresponding parts. Reference numeral 52 designates a refractory metal gate, numeral 23 designates an orientation flat, and numeral 50 designates a direction in which the refractory metal gate 52 is disposed. The semiconductor wafer 41 has a (100) surface orientation. In this third embodiment, the orientation flat 23 of the semiconductor wafer 41 is produced in a direction perpendicular to the direction 50 that makes an angle φ with the [0$\bar{1}\bar{1}$] direction, and the refractory metal gate 52 is produced on the surface of the wafer 41 in the direction 50, perpendicular to the orientation flat 23. In the ion implanting process, the semiconductor wafer 41 is tilted by an angle θ (tilt angle) with the orientation flat 23 as an axis of the tilting, and the ion beam 9 is applied to the wafer 41 so that the direction of the ion beam reaching the wafer surface makes the angle θ with the normal of the wafer surface.

In this third embodiment of the invention, since the ion implantation is performed not in perpendicular to, but oblique the surface of the semiconductor wafer 41, the ion implantation is not parallel to a crystal plane or a crystal axis in the semiconductor wafer 41. Therefore, channeling is prevented. When a GaAs wafer is employed, an optimum ion implantation for preventing channeling is realized when φ is 23° and θ is 7°~10°.

Although in the second embodiment the orientation flat is produced in the [01$\bar{1}$] direction and rotated by the angle φ in the ion implanting process, in this third embodiment the orientation flat 23 is produced in a direction that makes the angle φ with [01$\bar{1}$] direction. Therefore, in the ion implanting process, the side walls of the refractory metal gate 52 are parallel to the direction of the ion beam, so that unwanted invasion of implanted ions into a region under the refractory metal gate 52 is reduced, suppressing the short channel effect.

Furthermore, the refractory metal gate 52 is disposed on the surface of the semiconductor wafer 41 in a direction perpendicular to the orientation flat 23, and this direction of the gate 52 is identical to the direction of the refractory metal gate 55 with respect to the [01$\bar{1}$] direction of the orientation flat 22 according to the prior art. Therefore, when the gate and the n⁺ regions 8 are produced, a mask identical to the mask used in the prior art method can be used.

Although the ion implantation method according to this third embodiment is applied to the formation of n⁺ regions, it may be applied to the formation of n' regions in an LDD-SAGFET with the same effects as described above.

While in this third embodiment of the invention a semiconductor wafer having a (100) surface orientation is employed, a semiconductor wafer having a surface in a plane equivalent to the (100) plane or a semiconductor wafer having a surface in another crystal plane, such as a (111) plane, may be employed with the same effects as described above.

[Embodiment 4]

Figure 6:
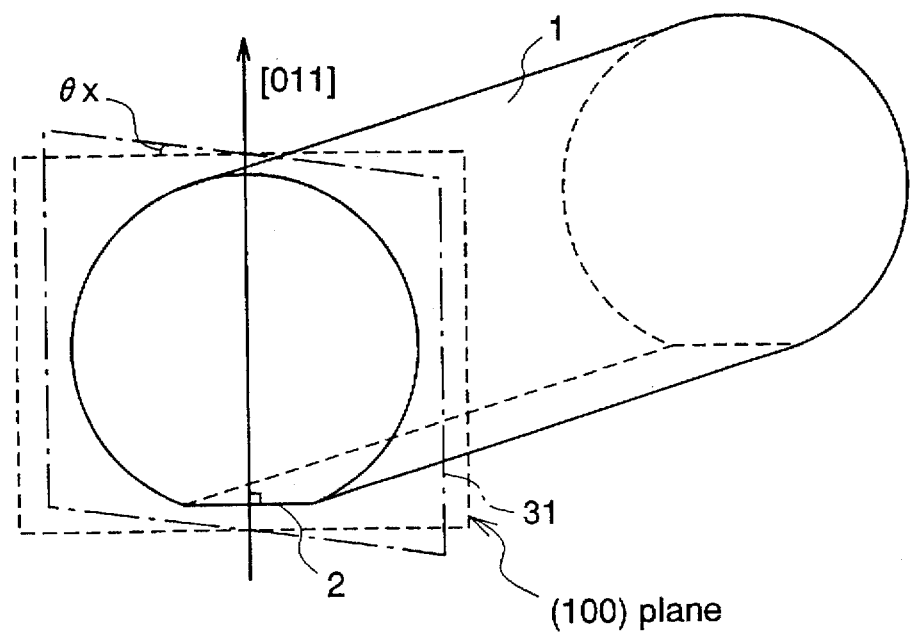
FIGS. 6(a) and 6(b) are diagrams for explaining a method of producing a semiconductor wafer in accordance with a fourth embodiment of the present invention.
Figure 6:
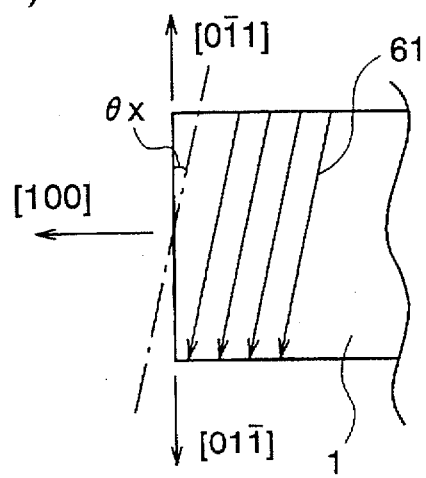
Figure 7:
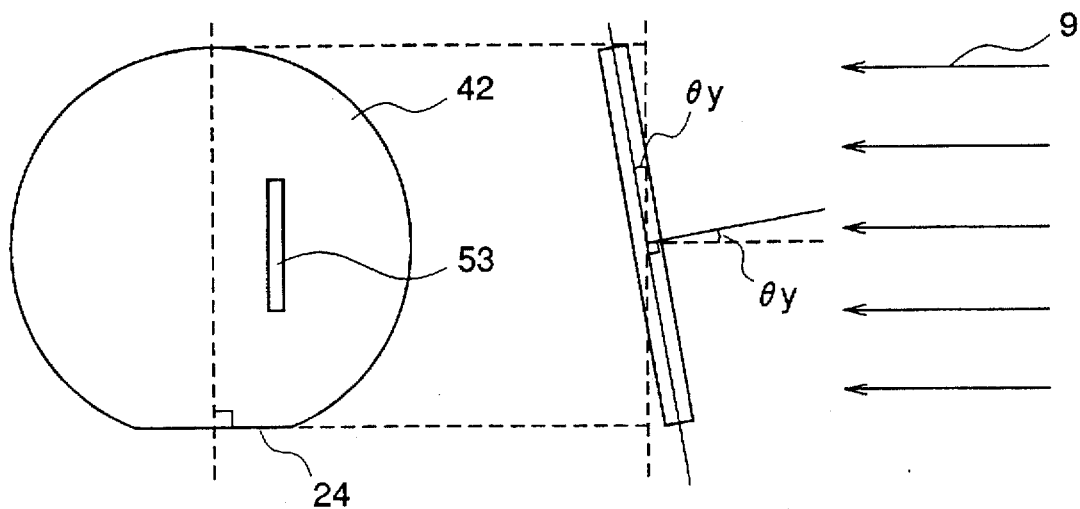
FIG. 7 is a diagram for explaining an ion implantation method according to the fourth embodiment of the invention.

FIGS. 6(a) and 6(b) are diagrams for explaining a method of producing a semiconductor wafer in accordance with a fourth embodiment of the present invention. FIG. 7 is a diagram for explaining an ion implantation method according to the fourth embodiment of the invention. In these figures, the same reference numerals as those in FIGS. 1 and 3 designate the same or corresponding parts. Reference numeral 31 designates a plane of the ingot 1 along which a semiconductor wafer is cut off, numeral 53 designates a refractory metal gate, numeral 42 designates a semiconductor wafer, numeral 24 designates an orientation flat of the wafer 42, and numeral 61 designates a wafer cut-off direction.

Initially, as illustrated in FIGS. 6(a) and 6(b), a semiconductor wafer is cut off along the plane 31 that is obtained by tilting the (100) plane of the ingot 1 by an angle θx with the [011] direction as an axis of the tilting. Then, as illustrated in FIG. 7, a refractory metal gate 53 is produced on the surface of the semiconductor wafer 42 in a direction perpendicular to the orientation flat 24. In the ion implanting process, the semiconductor wafer 42 is tilted by an angle θy (tilt angle), and the ion beam 9 is applied to the wafer 42 so that the direction of the ion beam 9 reaching the wafer surface makes the angle θy with the normal of the wafer surface.

In this fourth embodiment of the invention, since the ion implantation into the semiconductor wafer 42 is not parallel to the crystal axis or the crystal plane of the semiconductor wafer 42, channeling is avoided.

Further, the side walls of the refractory metal gate 53 are parallel to the direction of the ion beam 9. Therefore, when the n⁺ regions 8 are produced by the ion implantation, unwanted invasion of implanted ions into a region under the refractory metal gate 53 is reduced, whereby the short channel effect is suppressed.

In this fourth embodiment of the invention, the angles θx and θy are determined by decomposing the ion implanting direction 9 according to the prior art into a perpendicular direction component and a parallel direction component with respect to the refractory metal gate.

Figure 8:
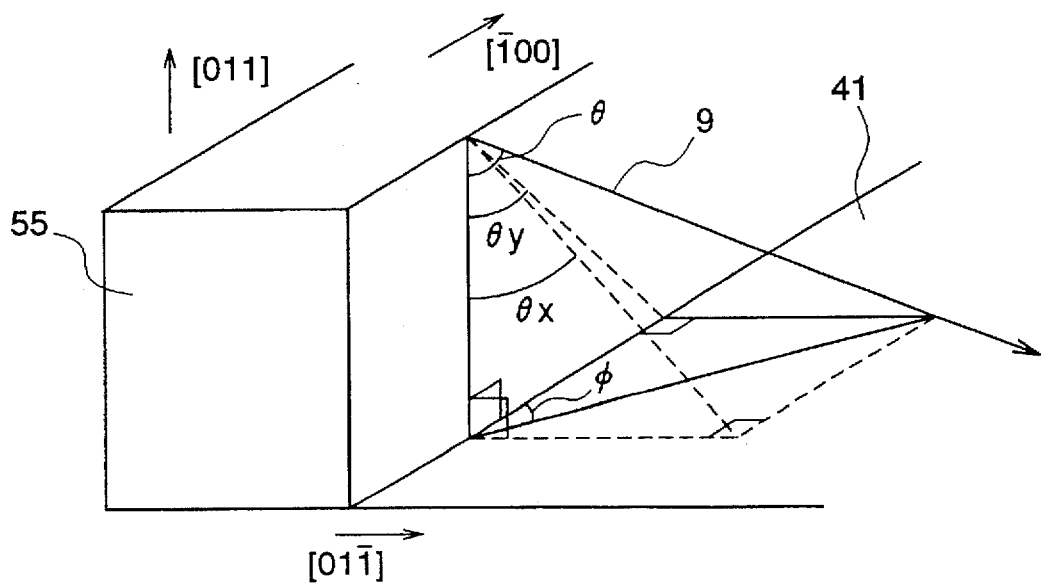
FIG. 8 is a perspective view, partly in section, illustrating a part of a semiconductor wafer in the vicinity of a refractory metal gate, for explaining a method of decomposing an ion implanting direction according to the prior art into two directions, [01$\overline{1}$] and [$\overline{1}$00], according to the fourth embodiment of the invention.

FIG. 8 is a perspective view illustrating a part of the semiconductor wafer 41 in the vicinity of the refractory metal gate 55. When the ion implanting direction 9 that is determined by a orientation flat rotating angle φ and the wafer tilting angle θ in the ion implantation method according to the prior art is decomposed into the direction perpendicular to the gate ([01$\bar{1}$] direction) and the direction parallel to the gate ([$\bar{1}$00] direction), the component θx of the ion implanting direction 9 that is perpendicular to the gate and the component θy of the ion implanting direction 9 that is parallel to the gate are represented by $$\theta x = \tan^{-1}(\tan\theta \sin\phi) \quad (1)$$

$$\theta y = \tan^{-1}(\tan\theta \cos\phi) \quad (2)$$

Since the optimum ion implanting direction for preventing channeling in the prior art method is a direction determined by an orientation flat rotating angle φ of 23° and a tilt angle θ of 10°, from the formulae (1) and (2), θx is 3.9° and θy is 9.2°. When the semiconductor wafer is produced and the ion implantation is performed using these angles, channeling is avoided and the short channel effect is suppressed with the highest efficiency.

Although the ion implantation method according to this fourth embodiment is applied to the formation of n⁺ regions, it may be applied to the formation of n' regions in an LDD-SAGFET.

While in this fourth embodiment of the invention a semiconductor ingot having a (100) surface orientation is employed, a semiconductor ingot having a surface in a plane equivalent to the (100) plane or a semiconductor ingot having a surface in another crystal plane, such as a (111) plane, may be employed with the same effects as described above.

While in this fourth embodiment the orientation flat 2 is taken along the [01$\bar{1}$] direction when the semiconductor ingot 1 has a (100) surface orientation, the orientation flat 2 may be in a direction equivalent to the [01$\bar{1}$] direction.

[Embodiment 5]

Figure 9:
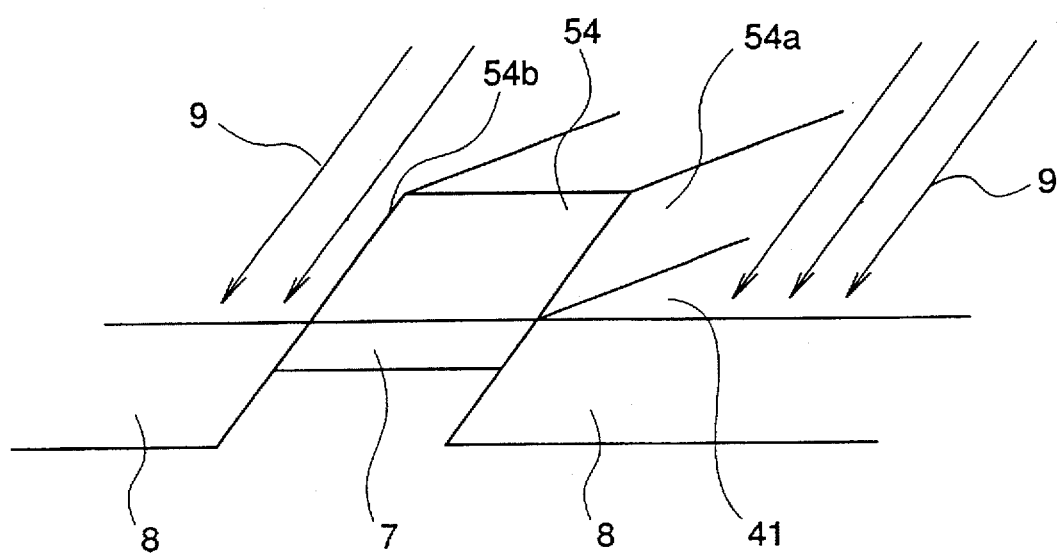
FIG. 9 is a perspective view, partly in section, illustrating a part of a semiconductor wafer in the vicinity of a refractory metal gate, for explaining an ion implantation method in accordance with a fifth embodiment of the present invention.
Figure 10:
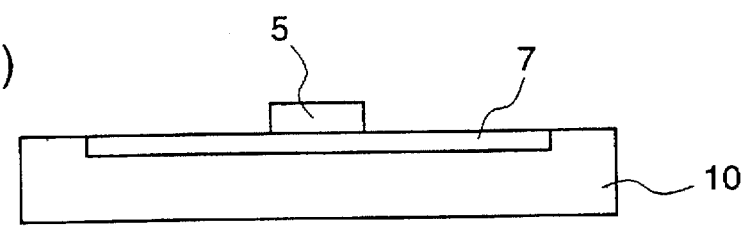
FIGS. 10(a)–10(c) are cross-sectional views illustrating process steps in a method of fabricating an SAGFET according to the prior art.
Figure 10:
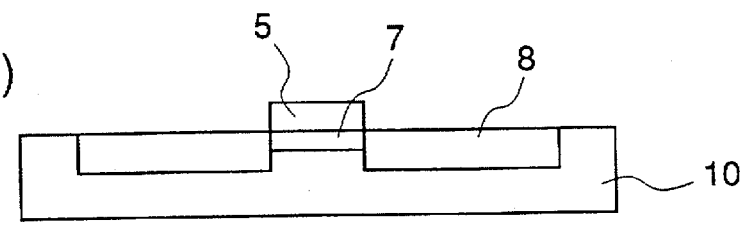
Figure 10:
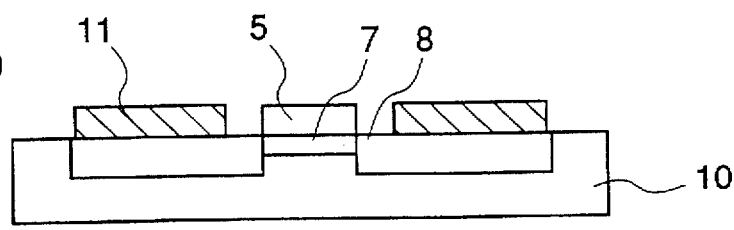
Figure 11:
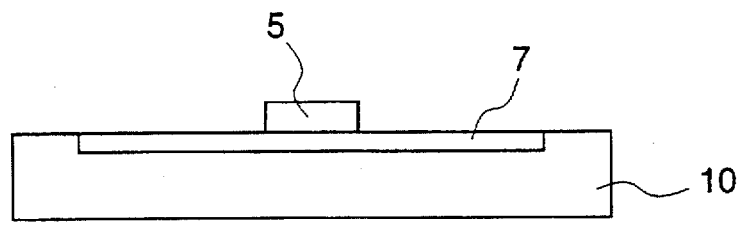
FIGS. 11(a)–11(e) are cross-sectional views illustrating process steps in a method of fabricating an LDD-SAGFET in accordance with the prior art.
Figure 11:
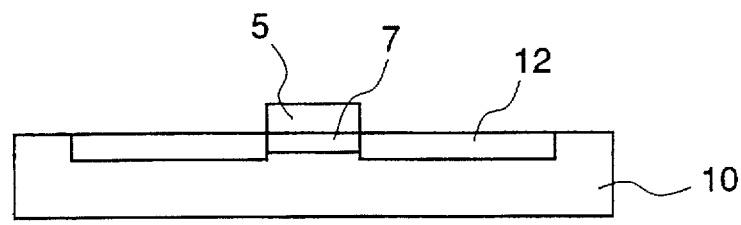
Figure 11:
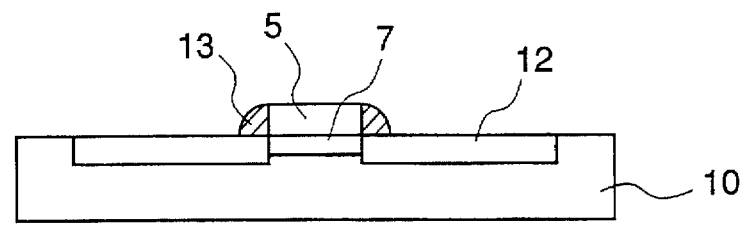
Figure 11:
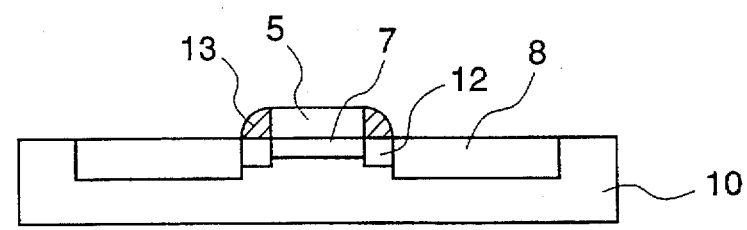
Figure 11:
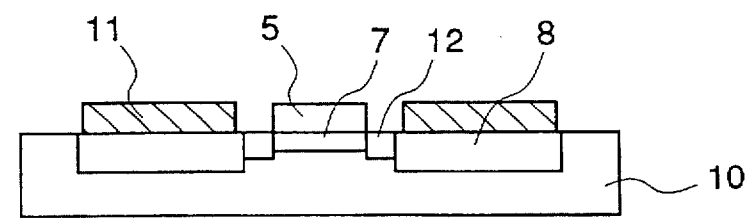

FIG. 9 is a perspective view, partly in section, illustrating a part of a semiconductor wafer, for explaining an ion implantation method according to a fifth embodiment of the present invention. In the figure, the same reference numerals as those in FIG. 3 designate the same or corresponding parts. Reference numeral 54 designates a refractory metal gate having side walls 54a and 54b.

In this fifth embodiment, the refractory metal gate 54 is produced so that the side walls 54a and 54b are inclined and parallel to the direction of ion beam 9 applied to the wafer 41 in the subsequent ion implantation. The refractory metal gate 54 with the inclined side walls 54a and 54b are realized by a diagonal etching of the gate metal. In the ion implantation process, as in the prior art method shown in FIG. 12, the semiconductor wafer 41 is rotated by an angle φ (OF rotating angle) with the center of the wafer surface as an axis of the rotation, and the semiconductor wafer 41 is tilted by an angle θ (tilt angle). After setting the wafer 41 as described above, ion implantation is performed so that the direction of the ion beam reaching the wafer surface makes the angle θ with the normal of the wafer surface.

In this fifth embodiment of the present invention, since the ion implantation is performed not perpendicular to, but oblique the surface of the semiconductor wafer 41, the ion implantation is not parallel to a crystal axis or a crystal plane of the wafer, whereby channeling is avoided. The optimum angles of φ and θ for preventing the channeling are 23° and 7°~10°, respectively, when a GaAs wafer is employed.

Further, since the side walls 54a and 54b of the refractory metal gate 54 are inclined so that the side walls are parallel to the ion implanting direction, when the n⁺ regions 8 are produced, unwanted invasion of implanted ions into a region under the refractory metal gate 54 is reduced, whereby the short channel effect is suppressed.

Although the ion implantation method according to this fifth embodiment is applied to the formation of n⁺ regions, it may be applied to the formation of n' regions in an LDD-SAGFET.

While in this fifth embodiment of the invention a semiconductor wafer having a (100) surface orientation is employed, a semiconductor wafer having a surface in a plane equivalent to the (100) plane or a semiconductor wafer having a surface in another crystal plane, such as a (111) plane, may be employed with the same effects as described above.

While in this fifth embodiment the orientation flat 2 is taken along the [01$\bar{1}$] direction when the semiconductor ingot 1 has a (100) surface orientation, the orientation flat 2 may be in a direction equivalent to the [01$\bar{1}$] direction.

Furthermore, in the SAGFETs fabricated by the methods according to the first to fifth embodiments of the invention, since the short channel effect is suppressed, a high k value and a stable threhold voltage are realized. Therefore, the SAGFETs can be employed as constituents of a digital IC that requires a high stability of the threshold voltage.

What is claimed is:

1. A method of producing a semiconductor device comprising:

preparing a semiconductor ingot having a (100) axial orientation, a (100) surface and an orientation flat in a [01$\bar{1}$] direction;

cutting the semiconductor ingot in a plane obtained by tilting the (100) surface by an angle θ from an axis obtained by rotating the orientation flat by an angle φ about the center of the (100) surface to approximately midway between adjacent [110] and [100] axes, thereby producing a semiconductor wafer having a surface;

producing a channel region in the semiconductor wafer;

producing a refractory metal gate on the surface of the semiconductor wafer; and using the refractory metal gate as a mask, implanting dopant impurity ions into the semiconductor wafer in a direction perpendicular to the surface of the semiconductor wafer, thereby producing impurity-implanted regions in the semiconductor wafer.

2. The method of claim 1 wherein φ is approximately 23°.

* * * * *